United States Patent

Fukuda et al.

Patent Number: 5,449,411
Date of Patent: Sep. 12, 1995

[54] MICROWAVE PLASMA PROCESSING APPARATUS

[75] Inventors: Takuya Fukuda; Junji Sato, both of Hitachi; Fumiyuki Kanai, Hoya; Atsushi Tsuchiya, Hitachi, all of Japan

[73] Assignee: Hitachi, Ltd., Tokyo, Japan

[21] Appl. No.: 137,974

[22] Filed: Oct. 19, 1993

[30] Foreign Application Priority Data

Oct. 20, 1992 [JP] Japan .................. 4-281680

[51] Int. Cl.6 .................... C23C 16/30; C23C 16/50
[52] U.S. Cl. .................... 118/723 MP; 118/723 MR; 118/723 E; 118/723 MW; 118/723 ME; 118/728; 156/345; 134/1
[58] Field of Search ... 134/1; 118/723 MP, 723 MW, 118/723 ME, 723 MR, 723 MA, 723 AN, 723 E, 723 ER, 728; 156/345, 643

[56] References Cited

U.S. PATENT DOCUMENTS

| | | | |
|---|---|---|---|
| 4,816,113 | 3/1989 | Yamazaki | 134/1 X |
| 4,960,071 | 10/1990 | Akahori et al. | 118/723 MP X |
| 5,006,192 | 4/1991 | Deguchi | 134/1 X |

FOREIGN PATENT DOCUMENTS

| | | |
|---|---|---|
| 1-231320 | 9/1989 | Japan . |
| 1-231321 | 9/1989 | Japan . |
| 1-231322 | 9/1989 | Japan . |
| 1-231323 | 9/1989 | Japan . |

OTHER PUBLICATIONS

Sugano, *Applications of Plasma Processes to VLSI Technology*, John Wiley and Sons, 1985, pp. 113, 154–155.

Primary Examiner—R. Bruce Breneman
Assistant Examiner—Jonathan D. Baskin
Attorney, Agent, or Firm—Antonelli, Terry, Stout & Kraus

[57] ABSTRACT

A microwave plasma processing apparatus is provided with a vacuum chamber, a substrate holder for mounting a substrate to be processed, a reactive gas feed port, a cleaning gas feed port, a plasma generation device for generating a processing plasma from the reactive gas and a cleaning plasma from the cleaning gas, and a high-frequency electric field application device for applying an electric field having a frequency that allows ions in the cleaning plasma to follow changes in the electric field. The high-frequency electric field application device is activated to apply the electric field to the cleaning plasma so as to remove substances that have been deposited on the surfaces of the vacuum chamber and substrate holder due to the processing of the substrate by the processing plasma, thereby cleaning up the vacuum chamber and substrate holder.

16 Claims, 8 Drawing Sheets

MICROWAVE PLASMA PROCESSING APPARATUS

BACKGROUND OF THE INVENTION

This invention relates to a method and apparatus for processing a substrate by use of plasma, and particularly to a technique that is suitable for a microwave plasma CVD apparatus for forming a thin film on a substrate to enhance performance in terms of operational efficiency and ease of maintenance.

A conventional microwave plasma processing apparatus is designed to clean up its interior, after a plasma-based process such as thin film formation, by application of a high-frequency electric field to the internal wall of the vacuum chamber in which the substrate has been processed so that deposits on the wall surface are etched off, as described in Japanese patent publications JP-A-1-231320, JP-A-1-231321, JP-A-1-231322, and JP-A-1-231323.

However, the above-mentioned conventional method is solely intended to clean up the vacuum chamber internal wall through application of the high-frequency electric field, and it does not consider the cleaning of places around the substrate holder where cleaning is most imperative. Moreover, the frequency of the applied electric field is not optimized and therefore the cleaning effect is not satisfactory. Another problem is that the cleaning operation promotes the sputtering of the internal wall surface, thereby spreading metallic contamination. A further problem is that for safety purposes, an expensive insulation structure is required for the chamber wall that functions as an electrode.

SUMMARY OF THE INVENTION

An object of this invention is to provide a microwave plasma processing method and apparatus capable of cleaning up places around the substrate holder sufficiently.

Another object of this invention is to provide a microwave plasma processing method and apparatus capable of preventing metallic contamination from the chamber internal wall from spreading due to sputtering.

Still another object of this invention is to provide a microwave plasma processing method and apparatus capable of economically achieving a prescribed degree of insulation.

The above objectives are accomplished in the following manner:

(1) A high-frequency electric field applied during the cleaning process is of such a frequency that the cleaning gas ions can follow changes in the electric field.

(2) A high-frequency electric field is mainly applied to the substrate holder.

(3) The electric field application electrode that is activated in the cleaning process is shaped such that normals of the electrode surface reach the portions of the internal wall surface of the vacuum chamber where cleaning is needed.

(4) When multiple electrodes (one of which may be the substrate holder) are used, each electrode is controlled independently.

The plasma-based cleaning process for the internal wall surface of the vacuum chamber is performed by ions and radicals in the plasma. Radicals move in accordance with the diffusion equation, whereas ions move in response to an electric field. In removing deposits on the wall surface by etching, the etching characteristics differ depending on the material of the deposits. Generally, ions in addition to radicals reaching the deposits provide impingement energy which is added to etching energy, resulting in a faster etching process. Particularly, insulating materials such as $SiO_2$ and SiN are etched not only by the impingement energy of the ions, but through direct reaction with the ions. Accordingly, it is crucial for an effective cleaning process to let ions reach places where deposits exist.

When a changing electric field acts on ions in a plasma, the ions move in response to the changes in the electric field. When the frequency of the electric field is raised to a certain value (e.g. above 1 MHz), the ions can no longer follow the changes in the electric field and thus become quiescent in a high-frequency electric field. Generally, ions are said to be capable of following a changing electric field when the ions move 1 mm or more in the electric field. The limit of frequency which ions can follow differs depending on the weight of the ions, and it is 1 MHz or lower in the case of fluorine ions, for example. Electrons weigh less than ions, and they can follow an electric field of a high frequency which ions cannot follow. Accordingly, only electrons reach an electrode to which a high-frequency electric field is applied, and the electrode has a negative induced d.c. potential with respect to the plasma.

Ions impinge on the electrode as a result of being attracted to the electrode by the induced d.c. potential. As a result, when an electric field of a high frequency which ions cannot follow is applied for cleaning, a cleaning process performed by the ions attracted by the d.c. takes place at the places where the high-frequency electric field is applied, while the ion-based cleaning process scarcely takes place in places where the high-frequency electric field is not applied.

When a high-frequency electric field which ions can follow is applied to the electrode, ions in the plasma reciprocate in a direction parallel to normals of the electrode surface in response to the high-frequency electric field applied to the electrode. Accordingly, ions reach not only the electrode surface, but also object surfaces located in the direction of the normals of the electrode surface, such that a cleaning process takes place for these object surfaces.

Since the ion impingement speed and the quantity of impinging ions are greater in places where the electric field is applied, the electric field is preferably applied to places where large deposits exist. A plasma processing apparatus for processing a substrate inherently produces large deposits on the substrate and substrate holder. Due to this, it is crucial for the effective cleaning of the substrate holder and the internal wall surface of the vacuum chamber to apply a high-frequency electric field which ions can follow to an electrode that is disposed on the substrate holder. If the electrode is disposed on the internal wall of the vacuum chamber, a large part of the deposits on the substrate holder are left unremoved even though the electrode is cleaned completely. Continuing the cleaning process after the electrode on the internal wall has been cleaned completely in an attempt to clean the substrate holder will produce etching and ion sputtering of the electrode on the internal wall, creating another contaminant.

When a cleaning electrode is disposed on the substrate holder, it is desirably installed such that normals of the electrode surface intersect with virtually the entire internal wall surface of the vacuum chamber, since ions reciprocate in a direction parallel to the normals of the electrode surface, and the interior of the vacuum chamber will be cleaned more evenly and effectively.

When more than one cleaning electrode is used, more effective cleaning can be achieved to match the quantity of deposits on the surfaces that confront the electrodes and the surfaces in the direction of the normals. The cleaning effect can be further improved by independently controlling the power and application time of a high-frequency electric field applied to each electrode.

For an apparatus based on electron cyclotron resonance (ECR), highly active plasma seeds, i.e., having a high cleaning effect, are created within an ECR region, and therefore positioning the ECR region in contact with or close to places where deposits are abundant or cleaning is difficult will achieve a more effective result.

An excessive cleaning process can be prevented through the provision of an interior inspection means that is operated during the cleaning process.

According to this invention, a vacuum chamber which has finished a plasma-based processing can be cleaned up in a short time, and consequently the conventional cleaning process that compels the apparatus to be open to the atmosphere is required less frequently, whereby the quality and throughput of products can be improved owing to the reduction of contaminants that are created in the film forming process. The inventive method and apparatus are capable of achieving a uniform cleaning speed for surfaces at various positions within the vacuum chamber, whereby the wear of component parts inside the apparatus due to the cleaning process can be prevented.

DESCRIPTION OF THE PREFERRED EMBODIMENTS

Embodiments of this invention will be explained with reference to the drawings.

Embodiment 1

Figure 2:
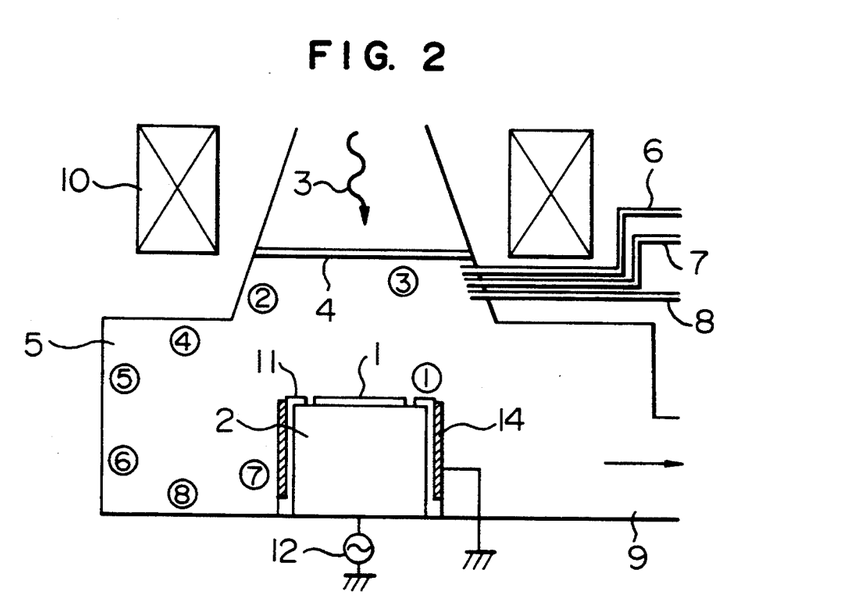
FIG. 2 is a cross-sectional diagram showing the principal portions of the apparatus based on the first embodiment of this invention.

FIG. 2 shows the cross section of the principal portions of the microwave plasma processing apparatus based on the first embodiment of this invention. The apparatus comprises a vacuum chamber 5 having a window 4 which transmits a microwave 3, a cylindrical substrate holder 2 disposed at the bottom of the vacuum chamber beneath the window 4, reactive gas conduits 6 and 7 for feeding substrate processing gases into the vacuum chamber, a cleaning gas conduit 8 for feeding a cleaning gas into the vacuum chamber, a gas evacuation port 9 formed in the wall of the vacuum chamber, an electromagnetic winding 10 disposed near the window 4 outside the vacuum chamber 5 for producing a magnetic field in the vacuum chamber, and a high-frequency power source 12 connected to the substrate holder 2.

The substrate holder 2 is designed to mount a substrate of 125-mm diameter, and a substrate 1 to be processed is mounted on the surface of the substrate holder 2 that confronts the window 4. The remaining surfaces of the substrate holder 2 are covered with a quartz insulation cover 11, which is enclosed on the cylindrical side surface of the substrate holder 2 by a cylindrical grounding electrode 14 made of stainless steel. The substrate holder is connected to the high-frequency power source 12 and the electrode 14 is grounded, and a high-frequency electric field is applied effectively to the substrate mounting surface.

Figure 3:
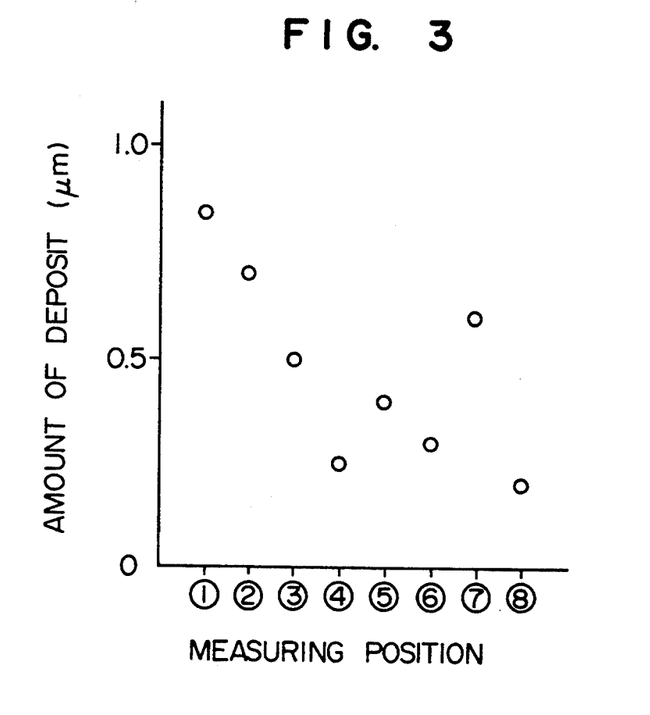
FIG. 3 is a graph resulting from the first embodiment of this invention, showing the amount of deposit at various positions in the apparatus after the formation of a $SiO_2$ film.

This apparatus was used to form a $SiO_2$ film on the substrate 1 by feeding $SiH_4$ gas at 20 ml/min and $O_2$ gas at 200 ml/min into the vacuum chamber 5 through the reactive gas conduits 6 and 7, evacuating the vacuum chamber to 0.3 Pa, applying a magnetic flux at a flux density of 875 gauss or more produced by the electromagnetic winding in a direction substantially normal to the substrate, and applying a microwave of 600 W. After microwave application for five minutes, a $SiO_2$ film with a thickness of 1 μm was formed on the substrate. FIG. 3 shows the amount of $SiO_2$ deposit at positions indicated by (1) through (8) in FIG. 2.

Figure 4:
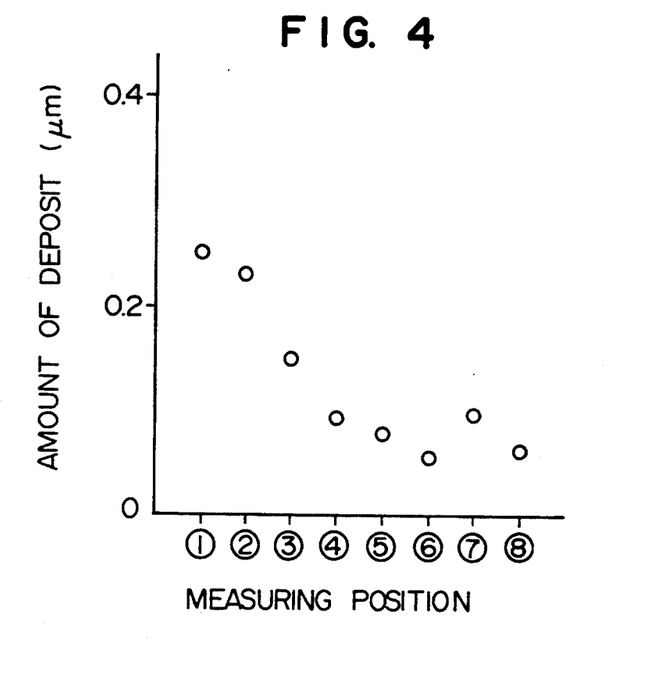
FIG. 4 is a graph resulting from the first embodiment of this invention, showing the amount of deposit remaining after a cleaning process at various positions in the apparatus.

After the substrate 1 with the $SiO_2$ film being formed thereon was taken out, the vacuum chamber was cleaned (etched) by feeding $C_2F_6$ gas through the cleaning gas conduit 8 in place of the reactive gases previously fed through reactive gas conduits 7 and 8, and applying the same microwave for five minutes to generate plasma. Besides the $C_2F_6$ gas, other useful cleaning gases include halogenide gases of $CF_4$, $CHF_3$, $SF_6$, $F_2$, HF, $Cl_2$ and HCl. FIG. 4 shows the amount of $SiO_2$ deposit at the positions (1) through (8) in FIG. 2 after cleaning.

It is crucial for the cleaning process to remove a deposit on the inner surfaces of the vacuum chamber evenly in a short time. However, the amount of deposit and the amount of etching at each position are different, and it is difficult to assess the uniformity of cleaning among the measuring positions through comparison of the graphs of FIGS. 3 and 4.

Figure 5:
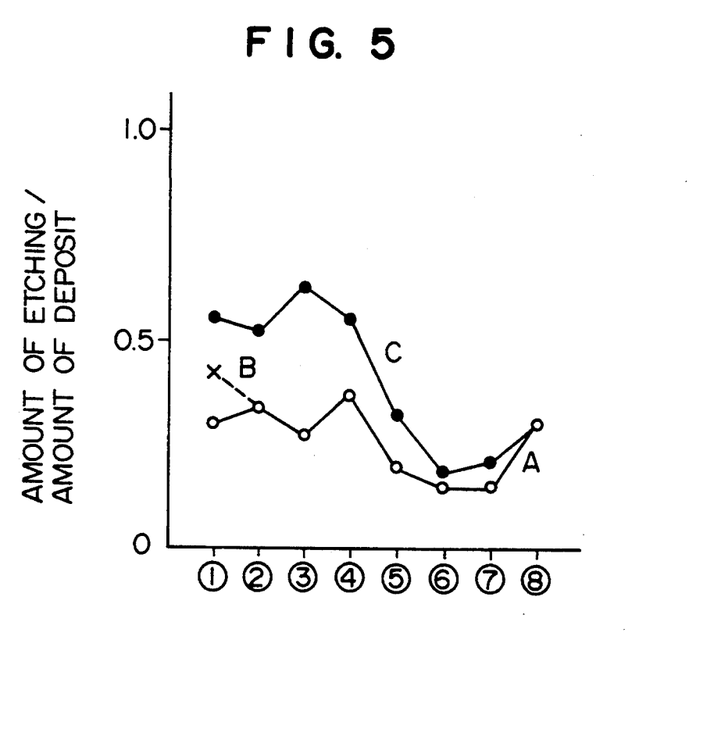
FIG. 5 is a graph resulting from the first embodiment of this invention, showing the ratio of the amount of etching and the amount of deposit at various positions in the apparatus for the formation of a $SiO_2$ film followed by a cleaning process.

For the easy assessment of the uniformity and speed of cleaning among the positions, FIG. 5 shows the ratio of the amount of etching to the amount of deposit at the measuring positions. On the graph, the solid line A is derived from the measurement results of FIGS. 3 and 4. FIG. 5 reveals that cleaning the deposit by merely replacing the reactive or film forming gases with the cleaning gas takes about three times as long as forming the film, and the cleaning efficiency is particularly low at the positions (6) and (7), i.e., the side wall of the substrate holder and the wall of the vacuum chamber confronting the side wall of the substrate holder.

Next, a high-frequency electric field of 13.56 MHz and 100 W produced by the high-frequency power source 12 was applied to the substrate holder 2 during the cleaning process. The result of this cleaning process is shown by the dashed line B in FIG. 5. The graph reveals that the cleaning speed is improved only at the position (1) which is part of the substrate holder 2 where the electric field was applied, and there is no effect at the other positions.

Next, the high-frequency power source was replaced and a high-frequency electric field of 400 kHz and 100 W was applied to the substrate holder 2 during the cleaning process. The result of the cleaning process is indicated by C in FIG. 5. The electric field of 400 kHz allows fluorine ions in the plasma to move in response to the changes in the electric field, and the ions can move along the electric lines of force within the reach of the electric field around the portion to which the electric field is applied. The result of measurement reveals that the cleaning speed was improved by about two times for the surface of the substrate holder 2 on which the substrate 1 is mounted and the confronting surface where the electric field is strong.

It can be concluded from the above examination that for the plasma-based cleaning process, the application of an electric field of a frequency which allows ions in the plasma which contribute to the cleaning to follow the changes in the electric field to the interior of vacuum chamber contributes significantly to the improvement of the cleaning speed.

Embodiment 2

Figure 1:
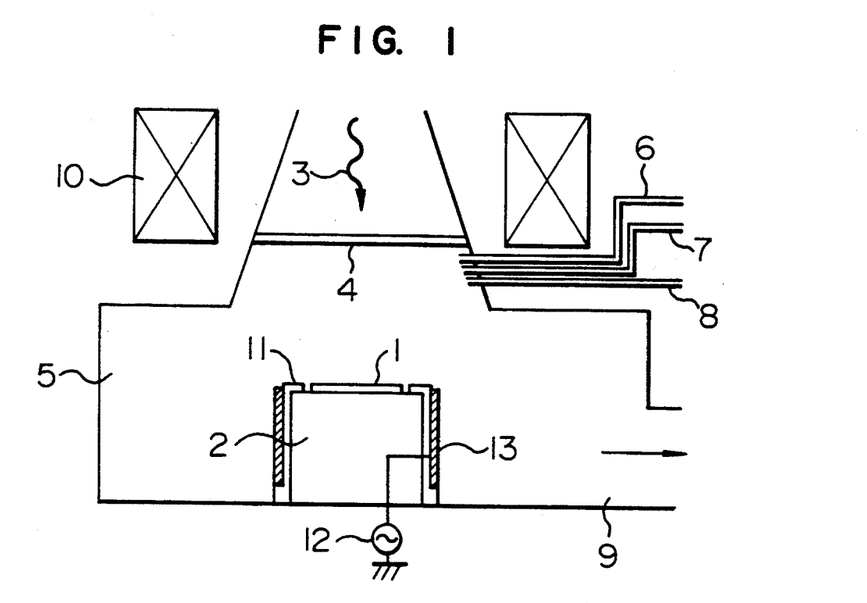
FIG. 1 is a cross-sectional diagram showing the principal portions of a microwave plasma processing apparatus based on the second embodiment of this invention.

FIG. 1 shows the cross section of the principal portions of the microwave plasma processing apparatus based on the second embodiment of this invention. This apparatus is derived from the one shown in FIG. 2, with only the grounding electrode 14 thereof being replaced with a cylindrical electric field application electrode 13 made of stainless steel.

Figure 6:
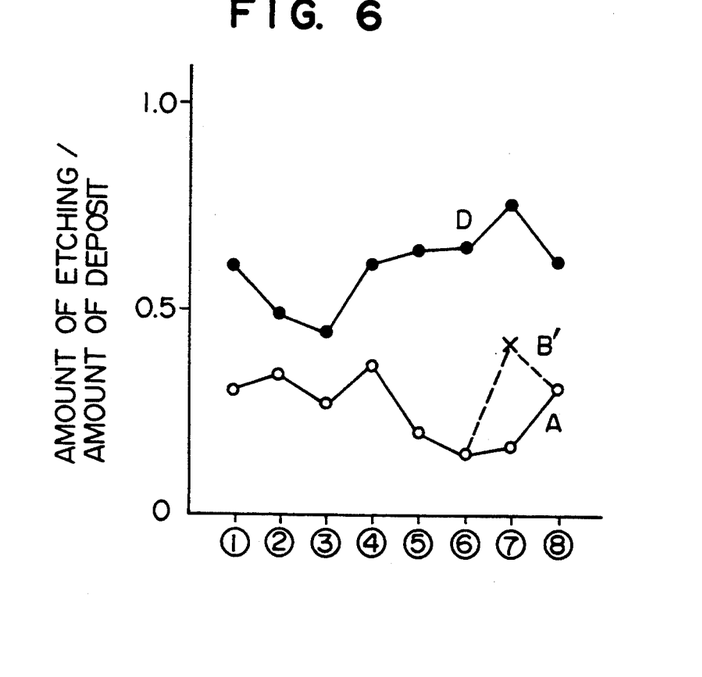
FIG. 6 is a graph resulting from the second embodiment of this invention, showing the ratio of the amount of etching and the amount of deposit at various positions in the apparatus for the formation of a $SiO_2$ film followed by a cleaning process.

Experiments with a cleaning process following the formation of a $SiO_2$ film under the same conditions as in the first embodiment were conducted. This time, the high-frequency electric field of 13.56 MHz/400 kHz and 100 W which was applied to the substrate holder in the first embodiment was applied to the cylindrical electrode 13. FIG. 6 shows the ratio of the amount of etching to the amount of deposit after the cleaning process at the measuring positions. On the graph, indicated by the dashed line B' is the result from the electric field of 13.56 MHz, and indicated by the solid line D is the result from the electric field of 400 kHz. The result of the cleaning process without the electric field application is also shown by the solid line A for reference.

FIG. 6 reveals that the cleaning effect is improved only for the surface to which the electric field is applied when the 13.56-MHz electric field which does not allow fluorine ions to follow the changes in the electric field was used, whereas the effect of electric field application extends beyond the surface to which the electric field is applied when the 400-kHz electric field which allows fluorine ions to follow the changes in the electric field is used. In addition, the high-frequency electric field is distributed more widely in the vacuum chamber as compared with the first embodiment, i.e., the high-frequency electric field existed virtually in only the top portion of the vacuum chamber in the first embodiment, whereas in this embodiment it existed effectively in most portions except at the surfaces above the substrate (positions (2) and (3)), resulting in an improved uniformity of cleaning.

It can be concluded from the above examination that the application of an electric field of a frequency which allows the ions to follow changes in the electric field to the substrate holder contributes to the improvement of the uniformity of cleaning as well as the speed of the cleaning process.

Embodiment 3

Figure 7:
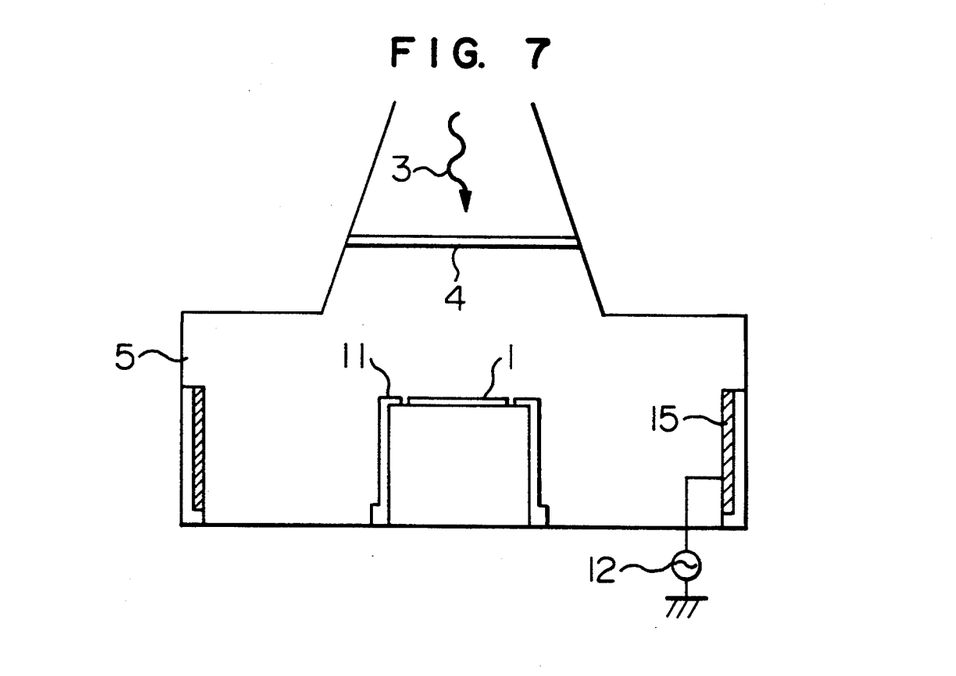
FIG. 7 is a cross-sectional diagram showing the principal portions of the conventional microwave plasma processing apparatus.

FIG. 7 shows the cross section of the principal portions of a conventional microwave plasma processing apparatus (the gas conduits, evacuation port and electromagnetic winding are not shown in the figure). In this apparatus, an electric field application electrode 15 made of stainless steel is disposed on the internal wall of the vacuum chamber. Remaining portions are identical to those of FIG. 1.

Figure 8:
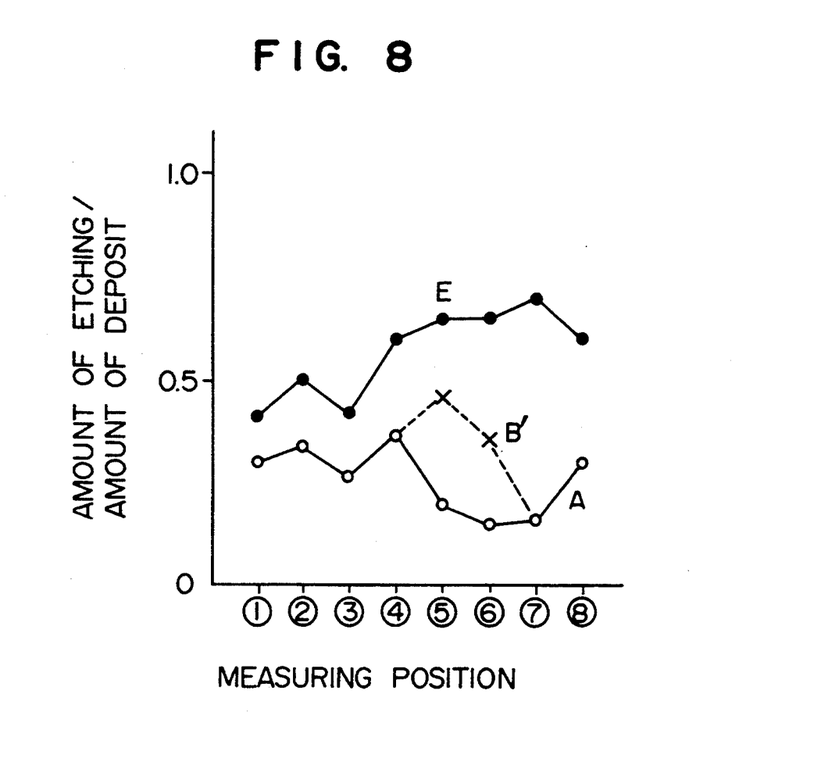
FIG. 8 is a graph resulting from the apparatus shown in FIG. 7, showing the ratio of the amount of etching to the amount of deposit at various positions in the apparatus for the formation of a $SiO_2$ film followed by a cleaning process.

Experiments with a cleaning process following the film formation under the same conditions as in the first and second embodiments were conducted. FIG. 8 shows the result of the cleaning process. On the graph, the solid line E indicates the result with the application of a 400-kHz electric field, the dashed line B' indicates the result with the application of a 13.56-MHz electric field, and the solid line A indicates the result without the electric field application. The graph of FIG. 8 reveals that when the 13.56-MHz electric field is used, the cleaning effect is improved only for part of the chamber internal wall where the electric field is applied, as in the second embodiment, and with the 400-kHz electric field being applied, the result is not much different from the second embodiment where the electric field is applied to the side of the substrate holder, although the cleaning effect is generally improved on wider surfaces.

Table 1 lists the number of contaminant particles having diameters of 0.3, 0.5 and 1.0 μm and the Fe count value on Si substrates of 125-mm diameter placed in the vacuum chamber after it has been cleaned based on the conventional apparatus of FIG. 7 and the inventive apparatus shown in FIG. 1 and then taken out of the chamber after one minute.

TABLE 1

| No. | Item | Number of contaminant particles | | | Fe count |
| --- | --- | --- | --- | --- | --- |
| | | 0.3 μm | 0.5 μm | 1.0 μm | |
| a | After deposition | 32 | 5 | 1 | 0 |
| b | RF*0W | 24 | 0 | 0 | 0 |
| c | RF*100w | 23 | 0 | 0 | 3 |
| d | RF*300w | 45 | 9 | 3 | 20 |
| e | HF**100w | 7 | 0 | 0 | 5 |
| f | HF**300w | 3 | 0 | 0 | 6 |
| g | HF**100w | 5 | 0 | 0 | 0 |
| h | HF**300w | 1 | 0 | 0 | 0 |

*: 13.56 MHz, **: 400 kHz

In the table, row a is a set of measured values following the SiO₂ film formation. Rows b, c and d are sets of measured values following the cleaning process based on the conventional apparatus of FIG. 7 with the application of 13.56-MHz electric fields of 0, 100 and 300 W, respectively. Rows e and f are sets of measured values following the cleaning process based on the conventional apparatus of FIG. 7 with the application of 400-kHz electric fields of 100 W and 300 W, respectively. Rows g and h are sets of measured values following the cleaning process based on the inventive apparatus shown in FIG. 1 with the application of 400-kHz electric fields of 100 W and 300 W, respectively.

The etching speed is substantially a linear function of the applied power. For example, etching with the application of a 300-W electric field is sped up by three times the degree of speed-up achieved by etching with the application of a 100-W electric field relative to the case of etching without application of an electric field.

In the case of row d of Table 1, the stainless steel electrode on the internal wall of the vacuum chamber is exposed to the cleaning plasma, and in the cases of rows f and h, the stainless steel electrode disposed on the side wall of the substrate holder or on the internal wall of the vacuum chamber is exposed to the cleaning plasma.

Table 1 reveals that the application of a 13.56-MHz electric field is effective for cleaning before the electrode is exposed to the plasma, but the number of contaminant particles and the Fe count increase, i.e., the contamination of the chamber increases due to the sputtering of the electrode, once the electrode is exposed to the plasma (the case of d). In the case of the 400-kHz electric field application, the contamination is not aggravated by the exposure of the electrode (the cases of f and h). However, when the electric field is applied to the electrode on the side wall of the substrate holder (the cases of g and h), the Fe count value cannot be determined. Namely, Fe is detected when the electric field is applied to the electrode on the internal wall of the chamber (the cases of e and f), although the contamination due to sputtering was not observed. Accordingly, contamination caused by sputtering arises in the cases of e and f. There is conceptually no big difference between the amount of electrode sputtering in the cases of f and h, and whether or not contamination arises is presumably dependent on the location of the electrode. When the electrode is located on the side wall of the substrate holder, the position at which the substrate is mounted is virtually in a blind spot with respect to the electrode surface, and it receives little spray from sputtering of the electrode.

It can be concluded from the above examination that when an electric field is used for cleaning, the cleaning process is made more effective by the selection of a frequency that allows ions to follow the changes in the electric field and the selection of an electrode position such that the electric field is formed in a direction extending away from the substrate holder, rather than toward the substrate holder.

Embodiment 4

Figure 9:
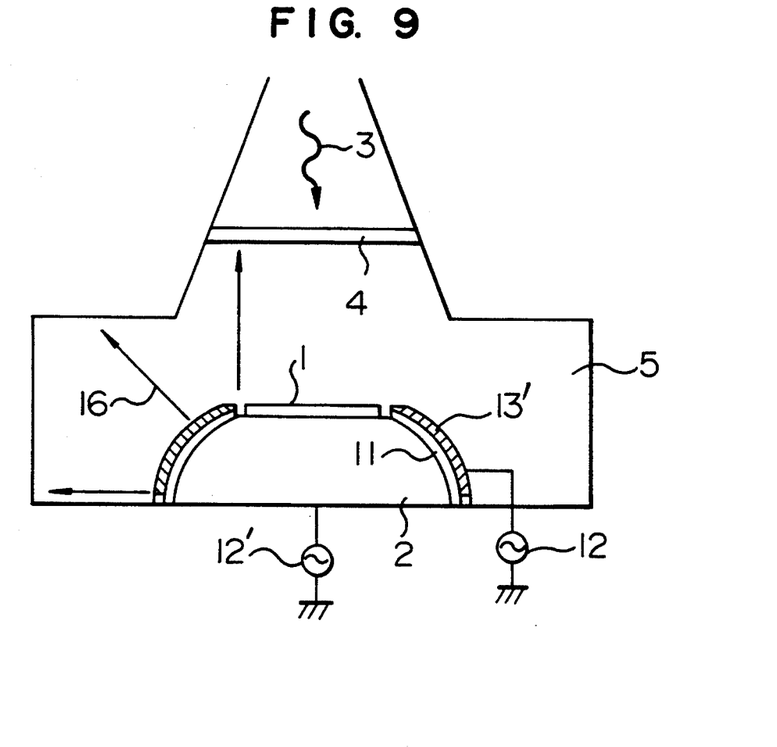
FIG. 9 is a cross-sectional diagram showing the principal portions of the apparatus based on the fourth embodiment of this invention.

FIG. 9 shows the cross section of the principal portions of the microwave plasma processing apparatus based on the fourth embodiment of this invention (the gas conduits, evacuation port and electromagnetic winding are not shown in the figure). This apparatus is derived from the one shown in FIG. 1, with the electric field application electrode thereof being reformed so as to change the directivity of the application of the electric field. The substrate holder 2 has its side wall shaped in a continuously curved surface extending from the top of the substrate holder to the bottom of the vacuum chamber, with an electric field application electrode 13' of the same formation being attached on the external surface of the side wall.

Figure 10:
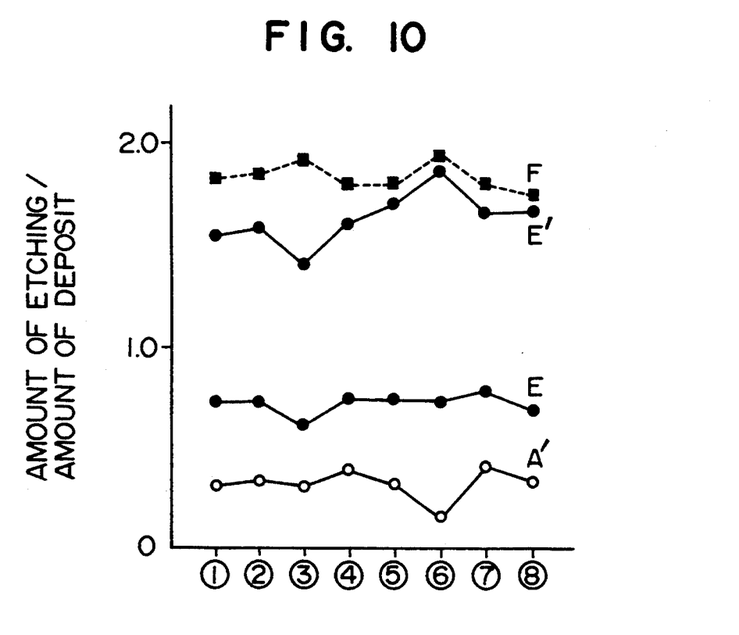
FIG. 10 is a graph resulting from the fourth embodiment of this invention, showing the ratio of the amount of etching to the amount of deposit at various positions in the apparatus for the formation of a $SiO_2$ film followed by a cleaning process.

Because of the shape of electrode 13', the range of intersection of normals 16 of the electrode surface with the internal wall of the vacuum chamber increases to cover virtually the entire internal wall surface. Experiments with a cleaning process were conducted for this apparatus, and FIG. 10 shows the result. Even without the electric field application as indicated by A', the amount of etching at the measuring position (7) differs from the case of the first embodiment as a result of the different shape of the substrate holder. On the graph of FIG. 10, indicated by A' is the result of the cleaning process without the electric field application, and indicated by E is the result with the application of an electric field of 400 kHz and 100 W to only the electrode 13'. Assuming normals in each unit area of the electrode surface, the number of intersections of the normals with a unit area of the cleaning surface is averaged among different places, and consequently the cleaning effect is also made uniform over the entire surface.

Indicated by E' is the result of the cleaning process with the application of a 400-kHz 300-W electric field. The graph reveals an improved cleaning effect resulting from the increased power. However, the ratio of the amount of etching to the amount of deposit is slightly smaller for the surface of window 4 which confronts the surface of the substrate holder on which the substrate is mounted, i.e., cleaning is not uniform. For the achievement of uniform cleaning, another high-frequency power source 12' was connected to the substrate holder 2 and the cleaning process was conducted with the application of an electric field of 400 kHz and 300 W to the electrode 13' and the application of an electric field of 400 kHz and 50 W to the substrate holder 2. The result of measurement is shown by the dashed line F in FIG. 10. The graph reveals that the cleaning effect is improved, particularly at positions (3), (2) and (1), and the cleaning result is virtually uniform.

It can be concluded from the above examination that the vacuum chamber is cleaned more evenly by determining the shape of the electric field application electrode such that it applies the electric field over a greater range on the internal wall of the chamber (the internal wall area reached by normals of the electrode surface), and by providing multiple electrodes (one of which can be the substrate holder) and independently controlling the power of the electric field applied to each electrode.

Embodiment 5

Figure 11:
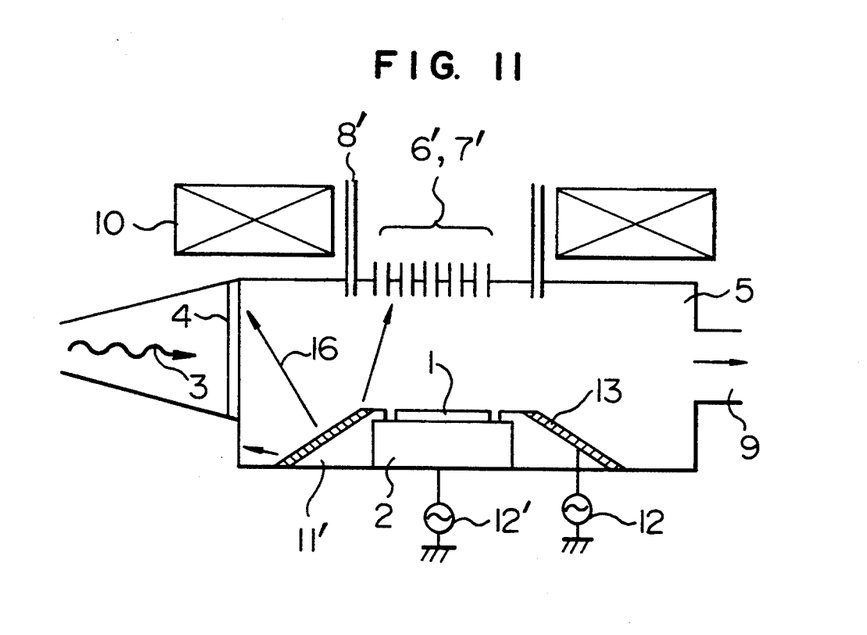
FIG. 11 is a cross-sectional diagram showing the principal portions of the apparatus based on the fifth embodiment of this invention.

FIG. 11 shows the microwave plasma processing apparatus of the fifth embodiment of this invention, which is based on the same principle as the foregoing apparatus, with a difference being that the microwave is introduced into the vacuum chamber in the direction parallel to the substrate surface. The magnetic field is formed in the top-to-bottom direction in the figure as in the foregoing embodiments, but the microwave is perpendicular to the top-to-bottom direction. In the figure, component parts 6', 7', 8' and 11' function identically to those indicated by 6, 7, 8 and 11 in FIG. 1.

In this embodiment, the quartz insulation cover 11' which surrounds the substrate holder 2 has the shape of a frustrum of a cone, with the electric field application electrode 13' having the same shape being attached to it.

It was confirmed for this apparatus that uniform cleaning is achieved when normals of the electrode and substrate holder surfaces reach the entire internal wall surface of the chamber, and the uniformity of cleaning is further improved through the independent control of the power of the electric fields applied to the electrode and the substrate holder.

Embodiment 6

The microwave plasma processing apparatus based on the sixth embodiment of this invention is derived from the one shown in FIG. 9, with the electric field application electrode 13' thereof being divided into sections which are insulated from one another.

It was confirmed for this apparatus that the uniformity of cleaning is further improved through the independent control of the power of the electric field applied to each electrode section.

Embodiment 7

Figure 12:
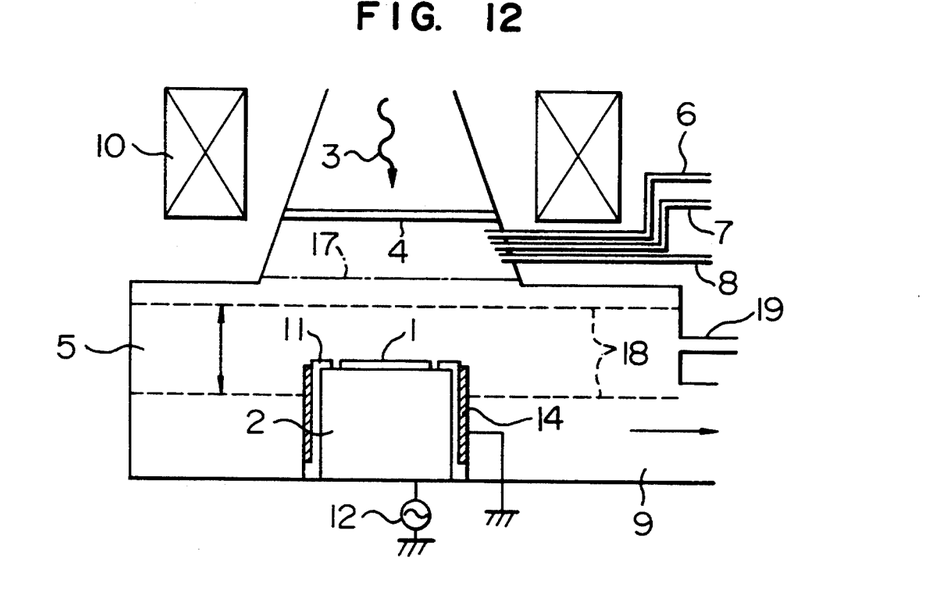
FIG. 12 is a cross-sectional diagram showing the principal portions of the apparatus based on the seventh and eighth embodiments of this invention.

The microwave plasma processing apparatus shown in FIG. 12 (the apparatus of FIG. 2, with a suction port 19 shown being unused in this embodiment) is operated for cleaning a $SiO_2$ film while applying an electric field of 400 kHz to the substrate holder 2 in the same manner as the first embodiment. Different from the first embodiment in which the magnitude of the applied magnetic field is kept constant during the film forming and cleaning processes, this embodiment is designed to strengthen the magnetic field, lower the location of an electron cyclotron resonance (ECR) region, and move the ECR region in the vertical direction during the cleaning process. Reference numeral 17 in FIG. 12 indicates the position of the ECR region during the film forming process, and reference numeral 18 indicates the top and bottom positions between which the ECR region is moved during the cleaning process.

Figure 13:
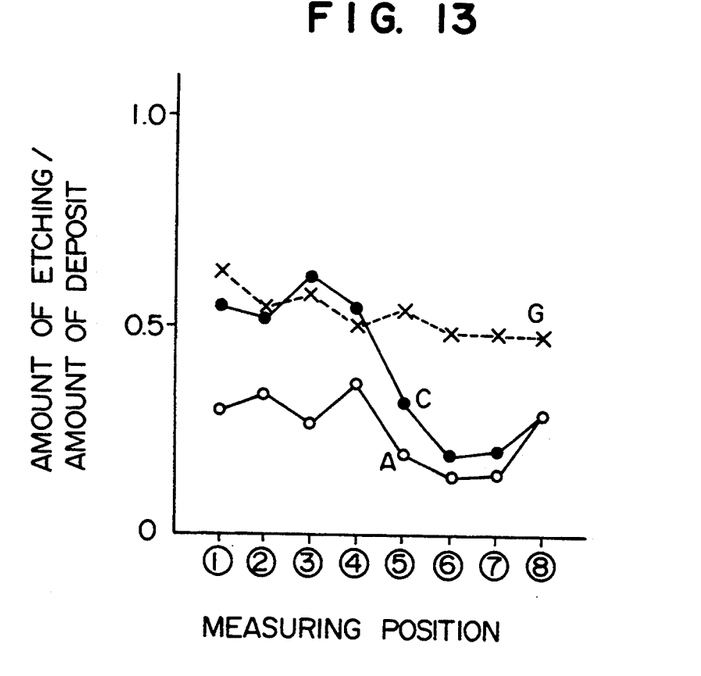
FIG. 13 is a graph resulting from the seventh embodiment of this invention, showing the ratio of the amount of etching to the amount of deposit at various positions in the apparatus for the formation of a $SiO_2$ film followed by a cleaning process.

FIG. 13 shows the result of measurement of the ratio of the amount of etching at cleaning to the amount of $SiO_2$ deposit after film formation at each measuring position. Indicated by A and C are the cleaning results with and without the application of an electric field which ions can follow, and indicated by G is the result with the application of an electric field which ions can follow and with moving the ECR region during the cleaning process. The graph reveals that the cleaning effect is particularly prominent in the portions of the chamber internal wall and holder side wall where the ECR region comes close and highly excited fluorine ions are generated by it.

It can be concluded from the above examination that the cleaning effect is further improved by repositioning the ECR region from the location for film formation to the location close to the wall surface where cleaning is generally difficult.

Embodiment 8

FIG. 12 shows the cross section of the principal portions of the microwave plasma processing apparatus based on the eighth embodiment of this invention. This embodiment is derived from the apparatus shown in FIG. 2, with a suction port 19 being added to the vacuum chamber 5, and remaining portions are identical to those of FIG. 2.

Experiments with a cleaning process were conducted with this apparatus in the same manner as in the previous embodiment of FIG. 2. In this case, particles in the vacuum chamber are drawn out through the suction port 19 and a differential evacuation device (not shown) connected to the suction port 19, and are subjected to mass analysis during the cleaning process.

Figure 14:
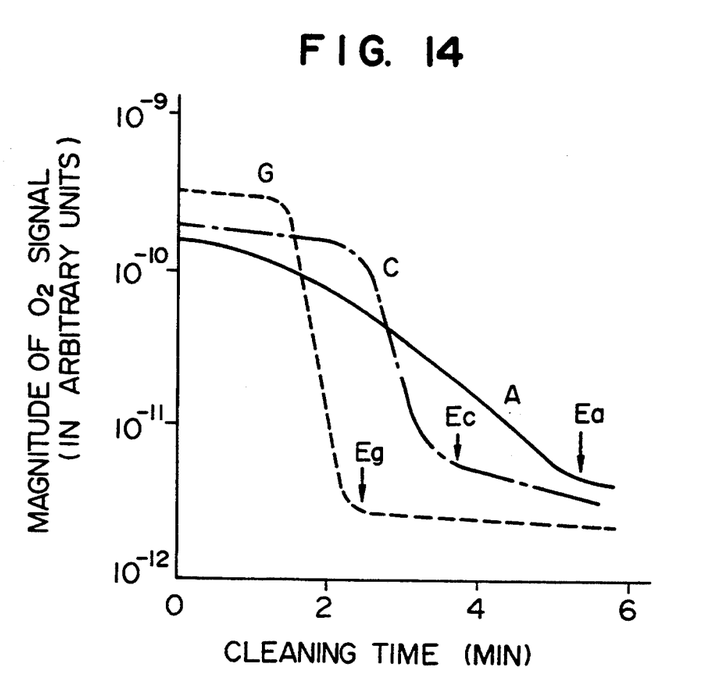
FIG. 14 is a graph resulting from the eighth embodiment of this invention, showing the trend in time of the m/e value of $O_2$ particles during the cleaning process.

The m/e value (m: mass of the particles, e: electric charge of the electron) was measured for each kind of particle. The value for $O_2$ varied most prominently during the cleaning process. FIG. 14 is a graph showing the result of the measurement, on which the m/e value is plotted on the vertical axis and the time elapsed since the beginning of cleaning is plotted on the horizontal axis. Indicated by A and C are the trends of the m/e value without and with the electric field application, respectively, with the ECR region being located as shown by 17 in FIG. 12. Indicated by G is the trend of the m/e value with the electric field application and with the ECR region being moved between the positions indicated by 18 in FIG. 12. Time points indicated by Ea, Ec and Eg on the trend curves A, C and G are presumed end points of cleaning.

The measurement results in conjunction with the graph of FIG. 13 reveal that the case G of the most uniform and fast etching completes the cleaning in the shortest time, and the cleaning end point is the most pronounced. In this case, the cleaning process was terminated at the end point Eg to inspect the interior of the vacuum chamber, and no residual contaminants were found. In the cases A and C, the end points Ea and Ec are somewhat obscure. In these cases, the cleaning process was terminated at the end points Ea and Ec, respectively, to inspect the interior of chamber, and a small amount of residual contaminants were found on the side wall of the substrate holder.

These measurement results suggest that the state of cleaning can be known from the trend of particle existence in the vacuum chamber during the cleaning process and that uniform cleaning can be achieved by controlling the operational parameters such that the trend curve bends sharply. It was confirmed that the observation of particles based on the emission spectrum of the plasma revealed a cleaning effect that is consistent with the result of the mass analysis.

Embodiment 9

For the microwave plasma processing apparatus of the previous eighth embodiment, the electric field application condition and ECR region moving condition that provide the strongest emission spectrum and the sharpest bend of the trend curve in the cleaning process were selected and input into the control program for the apparatus. As a result of the film forming process and the cleaning process based on this control program, high-quality semiconductor devices could be manufactured on a large production scale without leaving corrosion on the internal wall of the vacuum cleaner.

Embodiment 10

Figure 15:
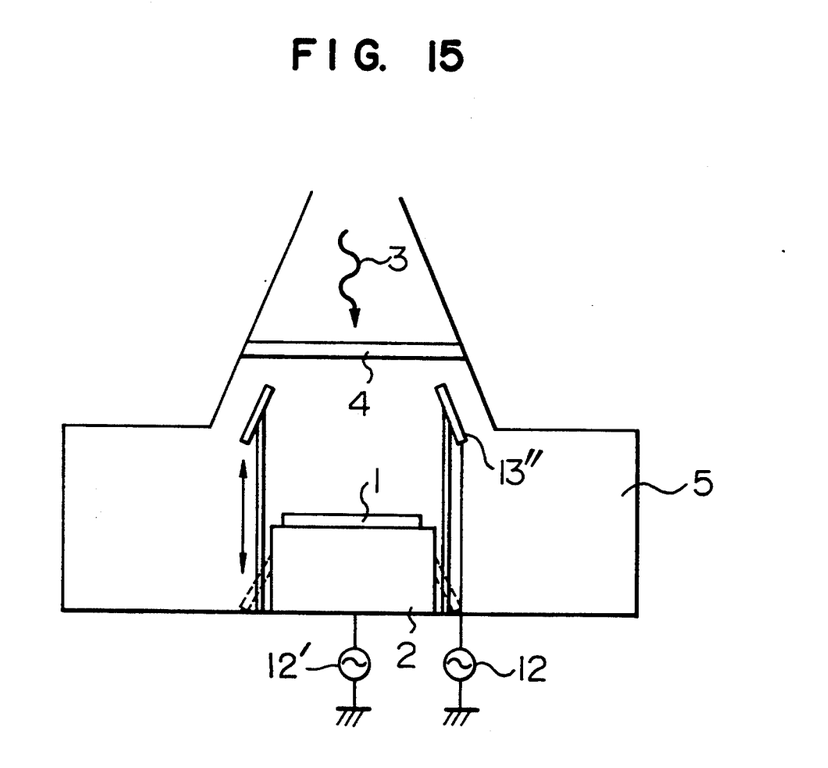
FIG. 15 is a cross-sectional diagram showing the principal portions of the apparatus based on the tenth embodiment of this invention.

FIG. 15 shows the cross section of the principal portions of the microwave plasma processing apparatus based on the tenth embodiment of this invention. The apparatus is derived from the ones shown in FIGS. 9 and 11, with the electric field application electrode being modified.

The electric field application electrode 13″ of this apparatus is designed to move vertically inside the apparatus. When the electrode is not being used, it is located around the substrate holder as shown by the dashed lines, and during the cleaning process, it is positioned opposing the upper tapered portion, for example, of the vacuum chamber as shown by the solid lines. The electrode position is finely adjusted according to the cleaning condition. For example, in case a deposit on the wall surface of the tapered portion is not easily removed, the electrode is brought close to that portion.

Although the foregoing embodiments are for cleaning of the interior of the vacuum chamber after the formation of a SiO2 film on a substrate based on microwave plasma CVD using electron cyclotron resonance in the presence of a magnetic field, the present invention can also be applied effectively to a cleaning process after the formation of other thin films such as high dielectric oxide films including a SiN film, a TiO2 film, a TIN film and a PbTiO3 film, oxide films for superconducting devices, organic films used for etching, and to a cleaning process for an etching apparatus.

The present invention can also be applied effectively to a microwave plasma processing apparatus which operates in the absence of a magnetic field.

We claim:

1. A microwave plasma processing apparatus comprising:
    a vacuum chamber;
    a substrate holder disposed in the vacuum chamber, the substrate holder having a substrate-holding surface for holding a substrate to be processed;
    reactive gas feeding means for feeding a reactive gas for use in processing the substrate into the vacuum chamber;
    cleaning gas feeding means for feeding a cleaning gas for use in cleaning the vacuum chamber and the substrate holder into the vacuum chamber;
    plasma generating means for generating a processing plasma from the reactive gas, and generating a cleaning plasma from the cleaning gas; and
    cleaning electric field applying means for applying, to the cleaning plasma, a cleaning electric field having a frequency that allows ions in the cleaning plasma to follow changes in the cleaning electric field such that substances that have been deposited on surfaces of the vacuum chamber and the substrate holder during the processing of the substrate with the processing plasma are removed, thereby cleaning the vacuum chamber and the substrate holder.

2. A microwave plasma processing apparatus according to claim 1, further comprising processing electric field applying means for applying, to the processing plasma, a processing electric field having a frequency useful in the processing of the substrate, the processing electric field applying means being operative independently of the cleaning electric field applying means.

3. A microwave plasma processing apparatus according to claim 1, wherein the substrate-holding surface of the substrate holder constitutes a first electrode;
    wherein the apparatus further comprises a second electrode covering a surface of the substrate holder other than the substrate-holding surface; and
    wherein the cleaning electric field applying means applies the cleaning electric field to the cleaning plasma through at least one of the first electrode and the second electrode.

4. A microwave plasma processing apparatus according to claim 3, wherein the second electrode has a shape such that lines normal to a surface of the second electrode and lines normal to a surface of the first electrode intersect an entire internal surface of the vacuum chamber other than a portion of the internal surface covered by the substrate holder.

5. A microwave plasma processing apparatus according to claim 3, wherein the cleaning electric field applying means applies the cleaning electric field to the cleaning plasma through the first electrode and the second electrode; and
    wherein the cleaning electric field applying means includes means for controlling application of the cleaning electric field to the cleaning plasma through the first electrode independently of application of the cleaning electric field to the cleaning plasma through the second electrode.

6. A microwave plasma processing apparatus according to claim 3, further comprising a third electrode disposed on an internal wall of the vacuum chamber;
    wherein the cleaning electric field applying means applies the cleaning electric field to the cleaning plasma through the third electrode and at least one of the first electrode and the second electrode.

7. A microwave plasma processing apparatus according to claim 3, further comprising means for moving the second electrode in the vacuum chamber.

8. A microwave plasma processing apparatus according to claim 1, wherein the plasma generating means generates the processing plasma and the cleaning plasma based on electron cyclotron resonance; and
    wherein the processing of the substrate includes forming a thin film on the substrate.

9. A microwave plasma processing apparatus according to claim 1, further comprising:
    means for removing particles from the vacuum chamber; and
    means for measuring an m/e value of the particles removed from the vacuum chamber, where m is a mass of one of the particles and e is an electric charge of an electron.

10. A microwave plasma processing apparatus according to claim 1, wherein the plasma generating means generates the processing plasma and the cleaning plasma based on electron cyclotron resonance (ECR) in an ECR region in the vacuum chamber.

11. A microwave plasma processing apparatus according to claim 10, wherein the plasma generating means includes means for moving the ECR region in the vacuum chamber during generation of the cleaning plasma.

12. A microwave plasma processing apparatus according to claim 1, wherein the frequency of the cleaning electric field is not greater than 1 MHz.

13. A microwave plasma processing apparatus according to claim 1, wherein the cleaning gas includes at least one of fluorine and a compound containing fluorine; and wherein the frequency of the cleaning electric field is 400 kHz.

14. A microwave plasma processing apparatus comprising:

a vacuum chamber;

a substrate holder disposed in the vacuum chamber, the substrate holder having a substrate-holding surface for holding a substrate to be processed, the substrate-holding surface constituting a first electrode;

a second electrode covering a surface of the substrate holder other than the substrate-holding surface, the second electrode having a shape such that lines normal to a surface of the second electrode and lines normal to a surface of the first electrode intersect at least half of an entire internal surface of the vacuum chamber other than a portion of the internal surface covered by the substrate holder;

reactive gas feeding means for feeding a reactive gas for use in processing the substrate into the vacuum chamber;

cleaning gas feeding means for feeding a cleaning gas for use in cleaning the vacuum chamber and the substrate holder into the vacuum chamber;

plasma generating means for generating a processing plasma from the reactive gas, and generating a cleaning plasma from the cleaning gas; and electric field applying means for applying, to the cleaning plasma, through the first electrode and the second electrode, a cleaning electric field having a frequency that allows ions in the cleaning plasma to follow changes in the cleaning electric field such that substances that have been deposited on surfaces of the vacuum chamber and the substrate holder during processing of the substrate with the processing plasma are removed, thereby cleaning the vacuum chamber and the substrate holder.

15. A microwave plasma processing apparatus according to claim 14, wherein the frequency of the cleaning electric field is not greater than 1 MHz.

16. A microwave plasma processing apparatus according to claim 14, wherein the cleaning gas includes at least one of fluorine and a compound containing fluorine; and wherein the frequency of the cleaning electric field is 400 kHz.

* * * * *